(12) United States Patent
Sahu et al.

(10) Patent No.: US 9,490,245 B1
(45) Date of Patent: Nov. 8, 2016

(54) CIRCUIT AND LAYOUT FOR A HIGH DENSITY ANTENNA PROTECTION DIODE

(71) Applicant: QUALCOMM Incorporated, San Diego, CA (US)

(72) Inventors: Satyanarayana Sahu, San Diego, CA (US); Renukprasad Shreedhar Hiremath, San Diego, CA (US); Radhika Vinayak Guttal, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/744,703

(22) Filed: Jun. 19, 2015

(51) Int. Cl.
*H01L 27/02* (2006.01)
*H01L 27/092* (2006.01)

(52) U.S. Cl.
CPC ......... *H01L 27/0266* (2013.01); *H01L 27/092* (2013.01)

(58) Field of Classification Search
CPC ........ H01L 27/0248–27/0255; H01L 27/0266
See application file for complete search history.

(56) References Cited

U.S. PATENT DOCUMENTS

| | | | |
|---|---|---|---|
| 5,793,069 A | 8/1998 | Schuelein et al. | |
| 6,091,114 A | 7/2000 | Mogul et al. | |
| 6,093,626 A * | 7/2000 | Su | H01L 27/0255 438/369 |
| 6,389,584 B1 * | 5/2002 | Kitahara | H01L 27/0207 716/115 |
| 6,862,723 B1 * | 3/2005 | Wang | G06F 17/5081 716/112 |
| 7,843,673 B2 * | 11/2010 | Ng | H01L 27/0255 361/56 |
| 8,194,371 B2 | 6/2012 | Tang et al. | |
| 8,217,458 B2 | 7/2012 | Golke et al. | |
| 8,872,269 B2 * | 10/2014 | Yang | H01L 27/0207 257/356 |
| 2002/0083404 A1 | 6/2002 | Ishikura | |
| 2011/0169091 A1 | 7/2011 | Kim et al. | |
| 2013/0140642 A1 | 6/2013 | Aruga et al. | |
| 2013/0249014 A1 | 9/2013 | Kito | |
| 2014/0173544 A1 | 6/2014 | Giraud et al. | |

FOREIGN PATENT DOCUMENTS

EP          0324185 A2       7/1989

OTHER PUBLICATIONS

International Search Report and Written Opinion—PCT/US2016/029392—ISA/EPO—Aug. 17, 2016.
Krishnan S., et al., "Antenna Protection Strategy for Ultra-Thin Gate MOSFETs", 36th Annual Reliability Physics Symposium Proceedings, 1998 IEEE International, Reno, Nevada, Mar. 31, 1998, XP031819923, pp. 302-306, ISBN: 978-0/7803-4400-6.

* cited by examiner

*Primary Examiner* — Patrick O'Neill
(74) *Attorney, Agent, or Firm* — Arent Fox LLP (57) ABSTRACT

A MOS device for reducing an antenna effect is provided. The MOS device includes a diode including a first nMOS transistor having a first nMOS transistor source, a first nMOS transistor drain, a first nMOS transistor gate, and an nMOS transistor body. The nMOS transistor body is coupled to a first voltage source and is an anode of the diode. The first nMOS transistor source, the first nMOS transistor drain, and the first nMOS transistor gate are coupled together and are a cathode of the diode. The MOS device further includes an interconnect extending between a driver output and a load input. The interconnect is coupled to the cathode of the diode. The interconnect may extend on one metal layer only between the driver output and the load input.

30 Claims, 6 Drawing Sheets

CIRCUIT AND LAYOUT FOR A HIGH DENSITY ANTENNA PROTECTION DIODE

BACKGROUND

1. Field

The present disclosure relates generally to circuits and layout construction, and more particularly, to a circuit and layout for a high density antenna protection diode.

2. Background

The antenna effect is an effect that can cause yield and reliability problems during the manufacture of metal oxide semiconductor (MOS) integrated circuits due to plasma induced gate dielectric damage. To avoid yield/reliability problems as a result of the antenna effect, a set of antenna rules may be followed. A violation of such rules may be called an antenna violation. Antenna violations may be avoided by adding a diode near a gate to protect the gate dielectric of the gate. Such diode may be referred to as an "antenna diode." There is currently a need for an improved antenna diode that provides improved protection to avoid antenna violations and has a compact layout.

SUMMARY

In an aspect of the disclosure, a MOS device for reducing an antenna effect is provided. The MOS device includes a diode and an interconnect. The diode includes a first n-type MOS (nMOS) transistor having a first nMOS transistor source, a first nMOS transistor drain, a first nMOS transistor gate, and an nMOS transistor body. The nMOS transistor body is coupled to a first voltage source and is an anode of the diode. The first nMOS transistor source, the first nMOS transistor drain, and the first nMOS transistor gate are coupled together and are a cathode of the diode. The interconnect extends between a driver output and a load input. The interconnect is coupled to the cathode of the diode.

In an aspect of the disclosure, a MOS diode includes a p-type MOS (pMOS) transistor and an nMOS transistor. The pMOS transistor has a pMOS transistor source, a pMOS transistor drain, a pMOS transistor gate, and a pMOS transistor body. The pMOS transistor drain, the pMOS transistor source, and the pMOS transistor body are coupled together and to a first voltage source. The nMOS transistor has an nMOS transistor source, an nMOS transistor drain, an nMOS transistor gate, and an nMOS transistor body. The nMOS transistor body is coupled to a second voltage source and is an anode of the diode. The second voltage source is lower than the first voltage source. The nMOS transistor gate, the nMOS transistor source, the nMOS transistor drain, and the pMOS transistor gate are coupled together and are a cathode of the diode.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

A standard cell is an integrated circuit that may be implemented with digital logic. An application-specific integrated circuit (ASIC), such as a system-on-a-chip (SoC) device, may contain thousands to millions of standard cells. Reducing a size/area footprint of ASICs is beneficial. As discussed supra, the antenna effect is an effect that can cause yield and reliability problems during the manufacture of MOS integrated circuits due to plasma induced gate dielectric damage. To avoid yield/reliability problems as a result of the antenna effect, a set of antenna rules may be followed. A violation of such rules may be called an antenna violation. Antenna violations may be avoided by adding an antenna diode near a gate to protect the gate dielectric of the gate. The addition of antenna diodes to avoid antenna violations increases an area footprint of ASICs including such antenna diodes. Accordingly, there is a need for an antenna diode that has a compact layout while providing improved protection for avoiding antenna violations.

Figure 1A:
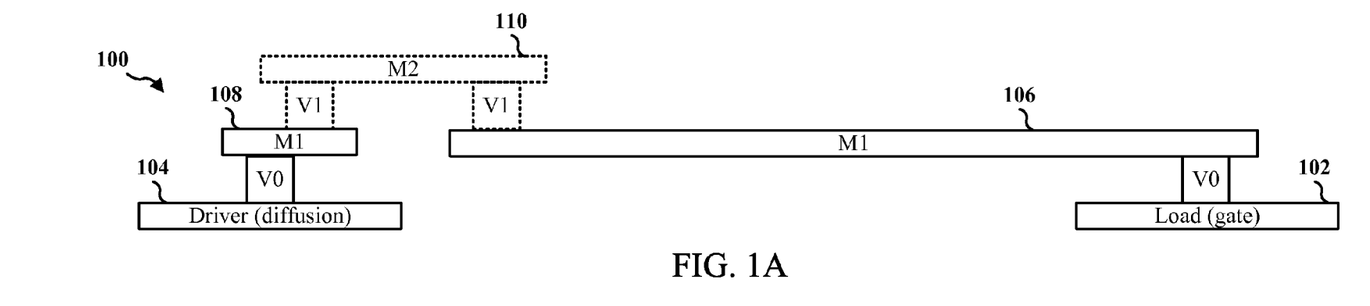
FIG. 1A is a diagram for illustrating an antenna effect and an antenna violation.
Figure 1B:
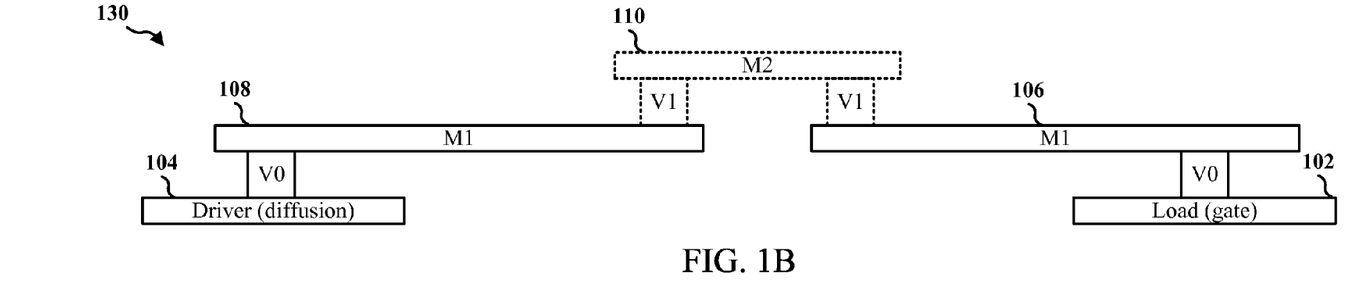
FIG. 1B is a diagram for illustrating a first approach for avoiding an antenna violation.
Figure 1C:
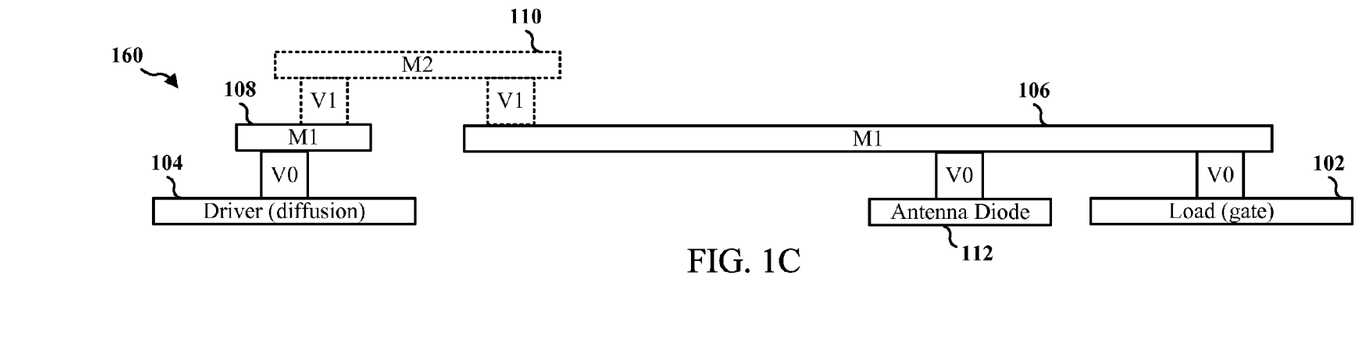
FIG. 1C is a diagram for illustrating a second approach for avoiding an antenna violation.

FIG. 1A is a diagram 100 for illustrating an antenna effect and an antenna violation. FIG. 1B is a diagram 130 for illustrating a first approach for avoiding an antenna violation. FIG. 1C is a diagram 160 for illustrating a second approach for avoiding an antenna violation. Referring to FIG. 1A, a net may include a driver (source/drain diffusion region) (also referred to as driver output) 104 and a load (gate) (also referred to as load input) 102. The source/drain diffusion region 104 may be coupled to the gate 102 through the metal one (M1) layer interconnect 108, the metal two (M2) layer interconnect 110, the M1 layer interconnect 106, and vias (V0, V1) for interconnecting the source/drain diffusion region 104, the gate 102, and the interconnects 106, 108, 110. During the fabrication/construction process of the net, before the gate 102 is coupled to the source/drain diffusion region 104, a voltage may build up (e.g., through an etching process) on the M1 layer interconnect 106. The voltage on the M1 layer interconnect 106 may be higher than the voltage normally supplied to the gate 102. The higher than normal voltage supplied to the gate 102 may cause the gate dielectric immediately below the gate to breakdown. This process may be referred to as gate dielectric breakdown. If the gate dielectric is silicon dioxide, such process may be referred to as gate oxide breakdown. Referring to FIG. 1B, an antenna violation may be avoided by shortening the M1 layer interconnect 106. The shortened M1 layer interconnect 106 is less likely to collect charge during the fabrication/construction process. Referring to FIG. 1C, alternatively, an antenna violation may be avoided by coupling a diode 112 (referred to herein as "antenna diode") to the M1 layer interconnect 106. The antenna diode 112 is configured to conduct current only at a voltage higher than the normal voltage supplied to the gate 102, but at a voltage lower than the voltage necessary to cause damage to the gate dielectric. For example, if a normal voltage supplied to the gate is $V_{dd}$ and the gate dielectric starts to break down at $V_B$, then the antenna diode 112 may be configured to conduct current when the voltage V across the antenna diode 112 is $V_{dd}<V<V_B$. While the addition of the antenna diode 112 does prevent antenna violations, the antenna diode 112 does add capacitance to the net, and increases an area footprint of ASICs including such antenna diodes 112. Accordingly, an antenna diode cell with a compact layout and minimal capacitance would be beneficial.

Figure 2:
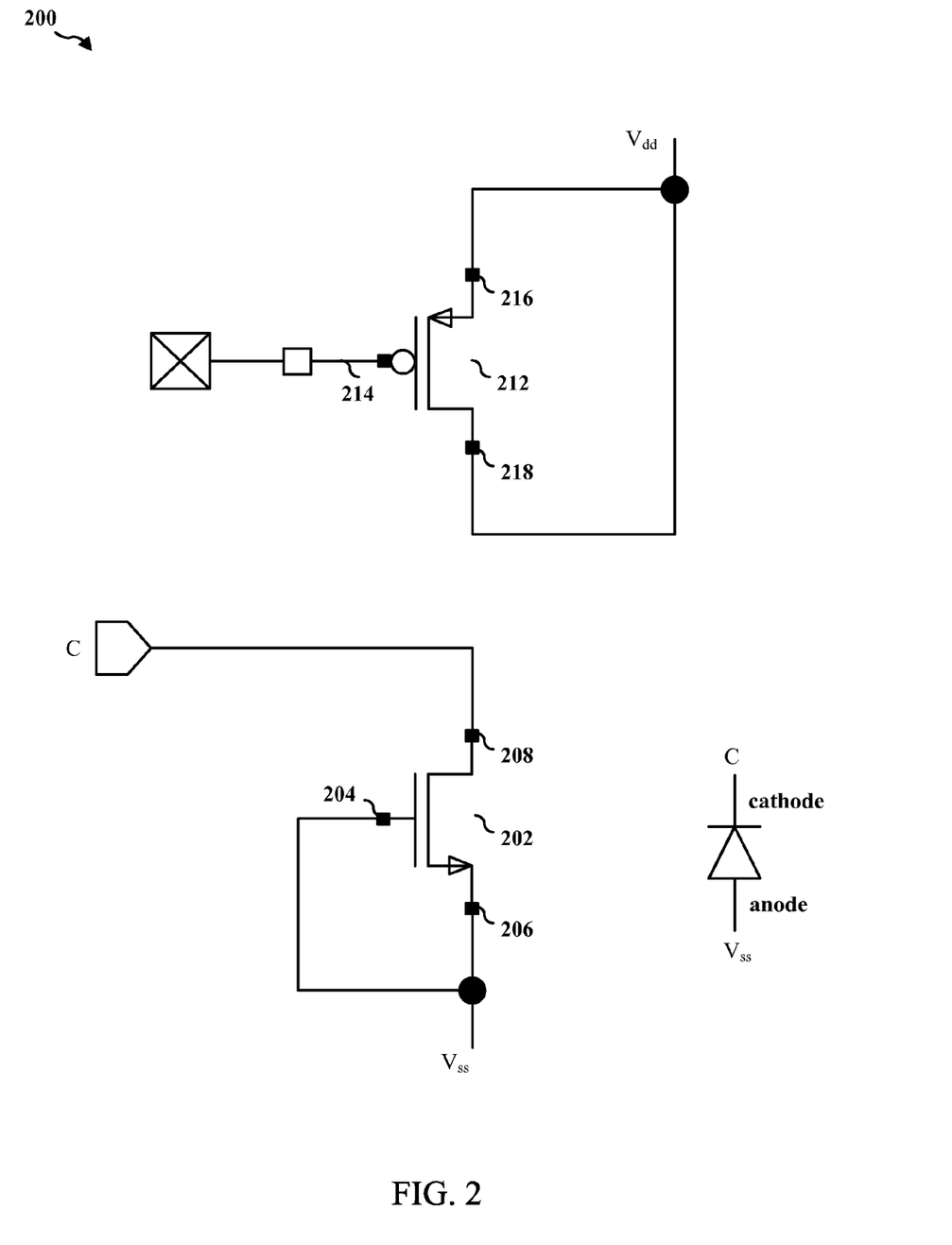
FIG. 2 is a circuit diagram for an antenna diode.

FIG. 2 is a circuit diagram 200 for an antenna diode. The antenna diode is formed by an nMOS transistor 202. The gate 204 of the nMOS transistor 202 is connected to the source 206 of the nMOS transistor 202, and the gate/source 204/206 is connected to $V_{ss}$. When the antenna diode is in a cell (e.g., standard cell), the corresponding pMOS transistor 212 is disconnected and inoperable. Specifically, the drain 218 of the pMOS transistor 212 is connected to the source 216 of the pMOS transistor 212, and the drain/source 218/216 is connected to $V_{dd}$. The gate 214 of the pMOS transistor may be floating. The drain 208 of the nMOS transistor 202 is the cathode and the source/gate 206/204 of the nMOS transistor 202 is the anode. The cathode of the antenna diode may be coupled to an interconnect (e.g., the interconnect 106) to reduce an antenna effect on a gate dielectric of a gate coupled to the interconnect.

Figure 3:
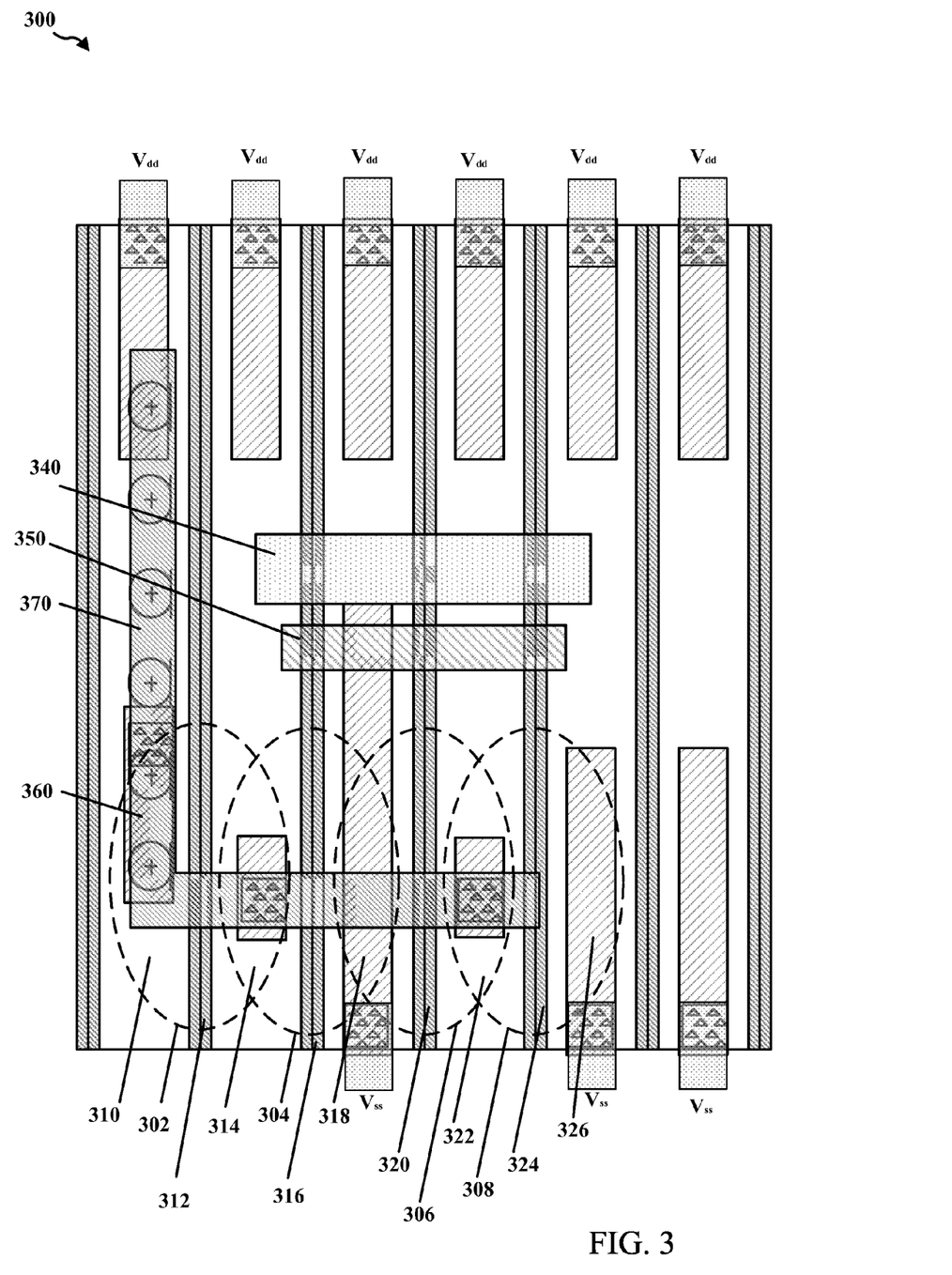
FIG. 3 is a cell layout of the antenna diode of FIG. 2.

FIG. 3 is a cell layout of the antenna diode of FIG. 2. As shown in FIG. 3, each of the pMOS gate interconnects are floating and the pMOS source/drains are connected to $V_{dd}$, and therefore the pMOS transistors are inoperable within the antenna diode cell. The antenna diode cell includes an nMOS transistor 302, an nMOS transistor 304, an nMOS transistor 306, and an nMOS transistor 308. The gate interconnects (also referred to as "POLY" interconnects) 316, 320, 324 of the nMOS transistors 304, 306, 308, respectively, are connected together by the metal POLY (MP) layer interconnect 350. The gates 316, 320, 324 are separated from the pMOS transistors by the cut POLY mask 340, which cuts the gate interconnects 316, 320, 324 during fabrication processing. The source 326 of the nMOS transistor 308 is coupled to $V_{ss}$. The source 318 of the nMOS transistors 304, 306 is also coupled to $V_{ss}$. The drain 322 of the nMOS transistors 306, 308 is coupled to the drain 314 of the nMOS transistor 304 by the M1 layer interconnect 360. The M1 layer interconnect 360 is also coupled to the diffusion region 310 of the nMOS transistor 302. Specifically, a metal diffusion (MD) layer interconnect contacts each of the drains 310, 314, 322, and the M1 layer interconnect 360 is coupled to each of the MD layer interconnects. The gate 312 of the nMOS transistor is floating. In the antenna diode cell of FIG. 3, the diffusion regions 310, 314, 322 serve as the drain of the antenna diode. The input (cathode) of the antenna diode cell is coupled to the interconnect 370. The output (anode) is $V_{ss}$.

The antenna diode cell of FIG. 3 has a width of six grids. An antenna diode cell with a smaller width that provides improves antenna protection is provided infra with respect to FIGS. 4, 5.

Figure 4:
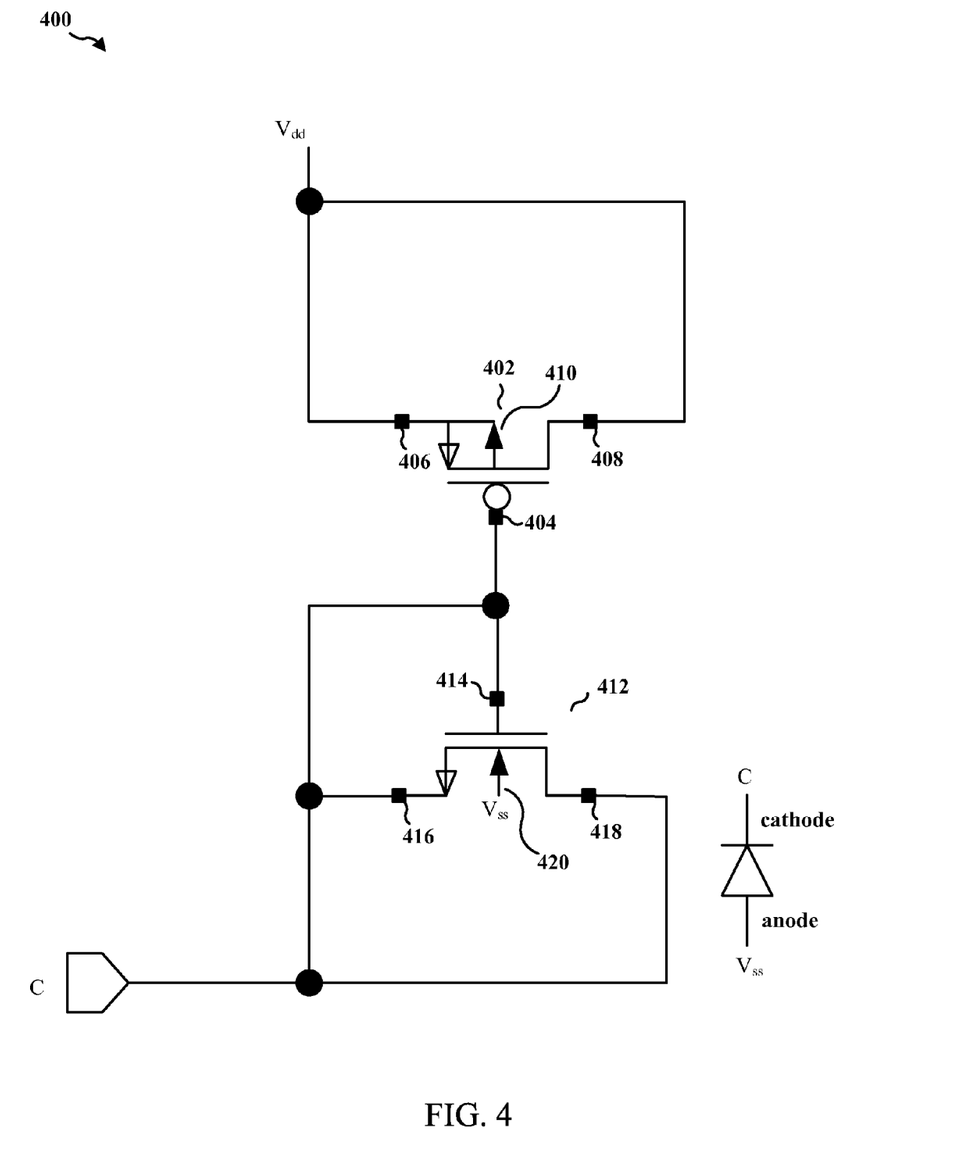
FIG. 4 is a circuit diagram for an exemplary antenna diode.

FIG. 4 is a circuit diagram 400 illustrating an exemplary antenna diode. The antenna diode includes a pMOS transistor 402 and an nMOS transistor 412. The drain 408, source 406, and body 410 of the pMOS transistor 402 are all connected together and to $V_{dd}$. The gate 404 of the pMOS transistor 402 is coupled to the gate 414 of the nMOS transistor. The source 416 and drain 418 of the nMOS transistor are coupled together and to the common gate connection between the pMOS transistor gate 404 and the nMOS transistor gate 414. The body 420 of the nMOS transistor is coupled to $V_{ss}$. The input (cathode) of the antenna diode is the common connection between the source 416, the drain 418, the pMOS transistor gate 404, and the nMOS transistor gate 414. The cathode of the antenna diode may be coupled to an interconnect (e.g., the interconnect 106) to reduce an antenna effect on a gate dielectric of a gate coupled to the interconnect. The output (anode) is $V_{ss}$.

Figure 5:
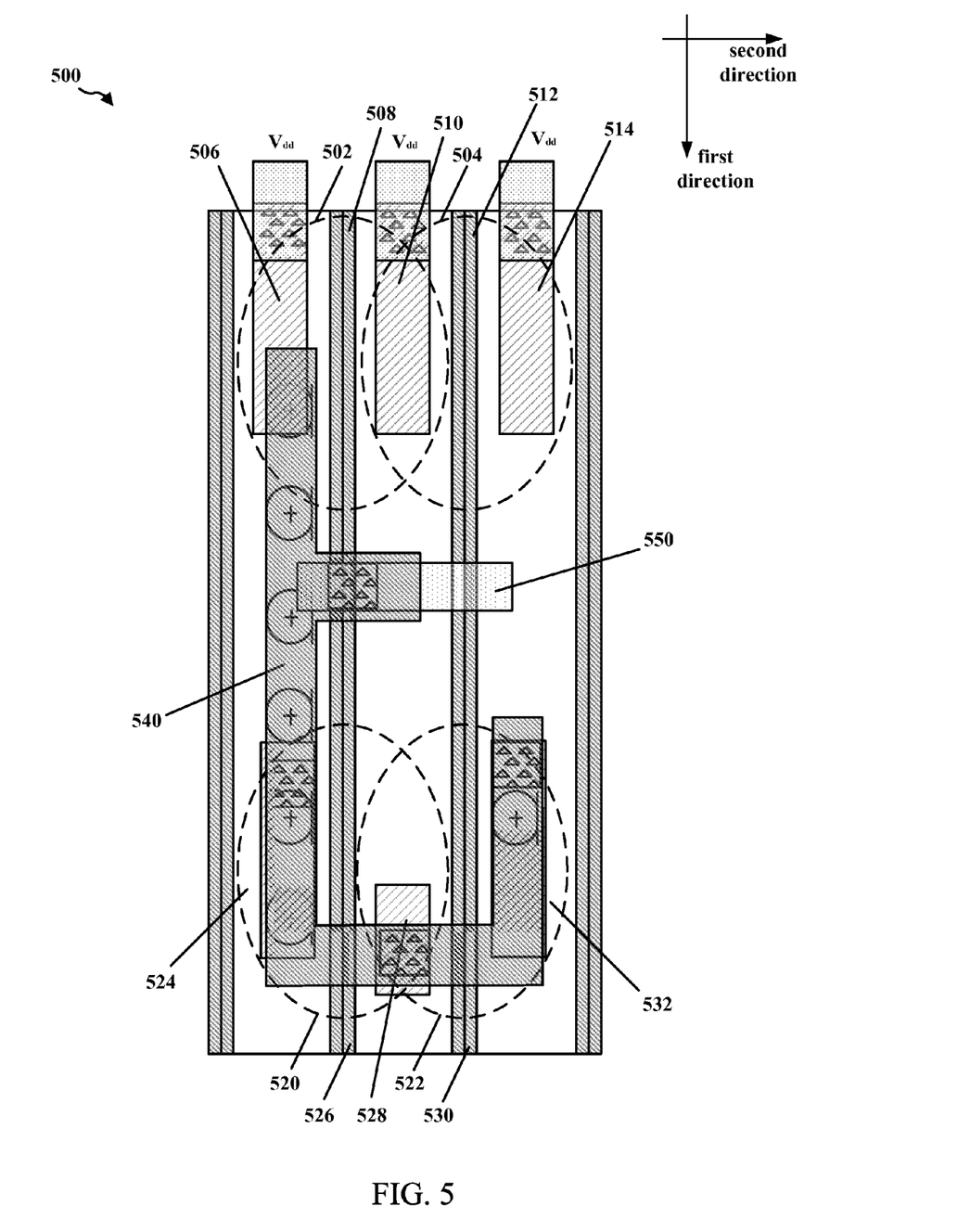
FIG. 5 is an exemplary cell layout of the exemplary antenna diode of FIG. 4.

FIG. 5 is an exemplary cell layout of the exemplary antenna diode of FIG. 4. As shown in FIG. 5, the antenna diode cell includes pMOS transistor 502, pMOS transistor 504, nMOS transistor 520, and nMOS transistor 522. Each of the diffusion regions 506, 510, 514 of the pMOS transistors 502, 504 are coupled to $V_{dd}$. For the pMOS transistor 502, the source/drain 506/510 may be considered interchangeable. For the pMOS transistor 504, the source/drain 510/514 may be considered interchangeable. Each of the diffusion regions 524, 528, 532 of the nMOS transistors 520, 522 are coupled to each other by the M1 layer interconnect 540. Specifically, an MD layer interconnect contacts each of the diffusion regions 524, 528, 532, and the M1 layer interconnect 540 is coupled to each of the MD layer interconnects. For the nMOS transistor 520, the source/drain 524/528 may be considered interchangeable. For the nMOS transistor 522, the source/drain 528/532 may be considered interchangeable. The gate 508 of the pMOS transistor 502 and the gate 526 of the nMOS transistor 520 are formed by the same gate interconnect, and the gate 512 of the pMOS transistor 504 and the gate 530 of the nMOS transistor 522 are formed by the same gate interconnect. The gate interconnects 508/526 and 512/530 extend in a first direction and are coupled together by the MP layer interconnect 550, which extends in a second direction orthogonal to the first direction. The MP layer interconnect 550 is coupled to the M1 layer interconnect 540. As such, the gate interconnect 508/526, the gate interconnect 512/530, and the source/drain of the nMOS transistors 520, 522 are all connected together. The body connection for the nMOS transistors 520, 522 is connected to $V_{ss}$, as discussed supra. The input (cathode) of the antenna diode cell may be coupled to the M1 layer interconnect 540 or the MP layer interconnect 550. The output (anode) is $V_{ss}$.

The amount of antenna protection provided by an antenna diode may be determined by the following equation:

$$\text{metal area}/(\text{gate oxide area}+2*RX \text{ antenna area}) = 1500.$$

The antenna diode cell of FIG. 3 has a cell width of six grids. Assume a receive (RX) antenna area of the antenna diode of FIG. 3 is 0.01411 um². The cathode is not connected to any gate interconnects, so the gate oxide area is 0. According to the above equation, the antenna diode of FIG. 3 can protect a metal area of approximately 42.33 um², which if the M1 layer interconnect coupled to the cathode of the antenna diode is 32 nm in width, would allow the M1 layer interconnect to have a maximum length of 1323 um. As such, the antenna diode of FIGS. 2, 3 can provide antenna protection to/prevent an antenna violation on an M1 layer interconnect up to length 1323 um.

The antenna diode cell of FIG. 5 has a cell width of three grids, and therefore is 50% smaller in area than the antenna diode cell of FIG. 3. Assume an RX antenna area of the antenna diode of FIG. 5 is 0.0132 um$^2$. The cathode is connected to two gate interconnects. Assume the gate oxide area is 0.0123 um$^2$. According to the above equation, the antenna diode of FIG. 5 can protect a metal area of approximately 58.1 um$^2$, which is 37% greater than the metal area that can be protected by the antenna diode of FIG. 3. If the M1 layer interconnect coupled to the cathode of the antenna diode of FIG. 5 is 32 nm in width, the antenna diode of FIG. 5 would allow the M1 layer interconnect to have a maximum length of 1816 um. As such, the antenna diode of FIGS. 4, 5 can provide antenna protection to/prevent an antenna violation on an M1 layer interconnect up to length 1816 um.

As discussed supra, the antenna diode of FIG. 5 has half the footprint of (is 50% smaller in area than) the antenna diode of FIG. 3. In addition, the antenna diode of FIG. 5 provides 37% greater antenna protection than the antenna diode of FIG. 3. Further, the antenna diode of FIG. 5 also has a substantially reduced leakage current of just 20% of the leakage current of the antenna diode of FIG. 3. In exchange for the benefits in area, antenna protection, and leakage current, the antenna diode of FIG. 5 has an increased input capacitance (36%) as compared to the antenna diode of FIG. 3 due to the gate connections. The increased input capacitance can slow the net to which the antenna diode is connected. However, as the total input capacitance is still relatively small, the increase in input capacitance may be negligible. For example, the antenna diode of FIG. 3 may have an input capacitance of 0.61 fF, and the antenna diode of FIG. 5 may have an input capacitance of 0.83 fF. The additional 0.22 fF is relatively small and has a negligible effect.

Figure 6:
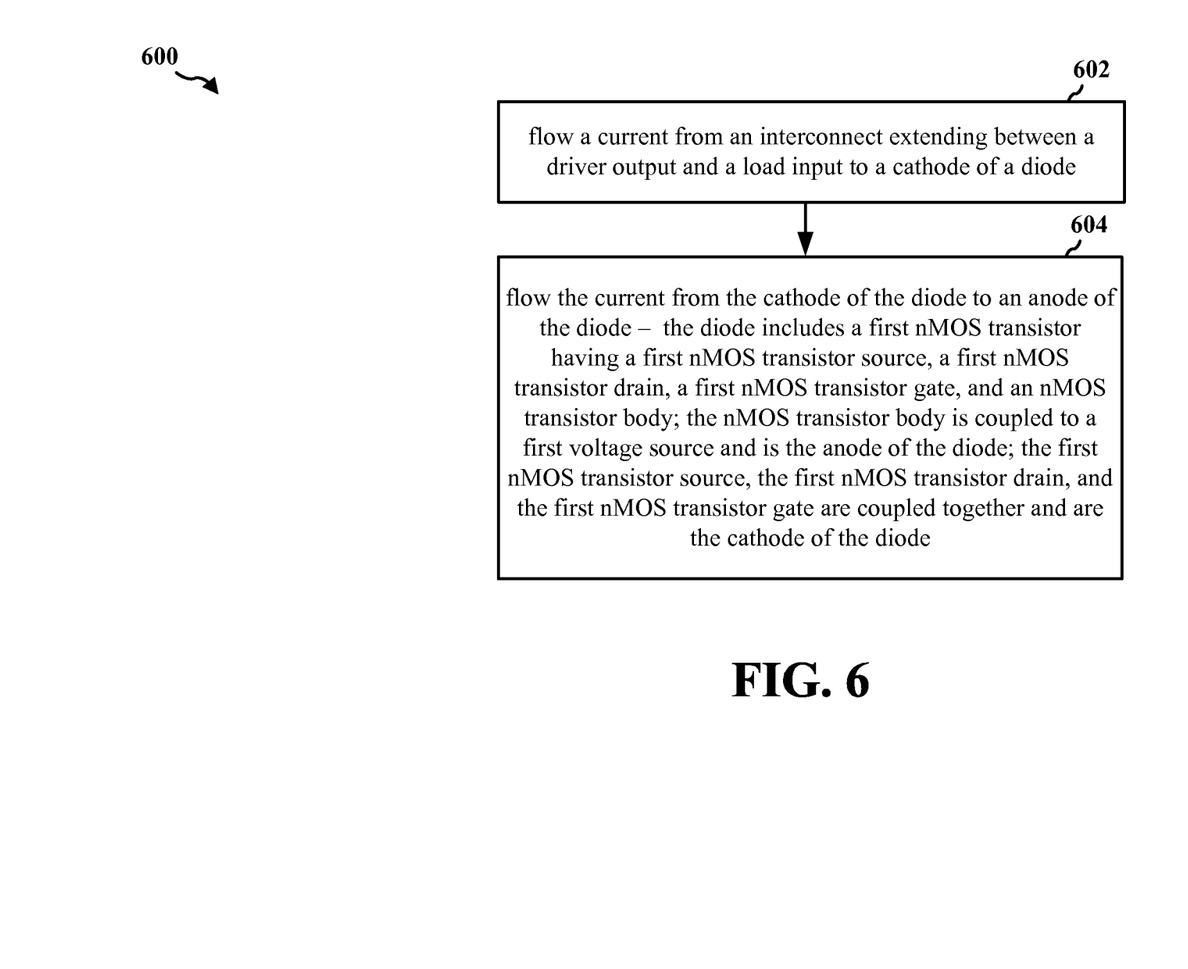
FIG. 6 is a flowchart of an exemplary method of the exemplary antenna diode of FIG. 4 and FIG. 5.

FIG. 6 is a flowchart 600 of an exemplary method of the exemplary antenna diode of FIG. 4 and FIG. 5. At 602, a current is flowed from an interconnect extending between a driver output and a load input to a cathode of a diode. At 604, the current is flowed from the cathode of the diode to an anode of the diode. The diode includes a first nMOS transistor having a first nMOS transistor source, a first nMOS transistor drain, a first nMOS transistor gate, and an nMOS transistor body. The nMOS transistor body is coupled to a first voltage source and is the anode of the diode. The first nMOS transistor source, the first nMOS transistor drain, and the first nMOS transistor gate are coupled together and are the cathode of the diode.

Referring again to FIGS. 1C, 4, and 5, a MOS device for reducing an antenna effect includes a diode 112 including a first nMOS transistor 412 having a first nMOS transistor source 416, a first nMOS transistor drain 418, a first nMOS transistor gate 414, and an nMOS transistor body 420. The nMOS transistor body 420 is coupled to a first voltage source $V_{ss}$ and is an anode of the diode 112. The first nMOS transistor source 416, the first nMOS transistor drain 418, and the first nMOS transistor gate 414 are coupled together and are a cathode of the diode 112. The MOS device further includes an interconnect 106 extending between a driver output 104 and a load input 102. The interconnect 106 is coupled to the cathode of the diode 112. In one configuration, the interconnect 106 extends on one metal layer only (e.g., the M1 layer) between the driver output and the load input.

In one configuration, the diode 112 further includes a second nMOS transistor having a second nMOS transistor source, a second nMOS transistor drain, a second nMOS transistor gate, and the nMOS transistor body. The first nMOS transistor source, the first nMOS transistor drain, the first nMOS transistor gate, the second nMOS transistor source, the second nMOS transistor drain, and the second nMOS transistor gate are coupled together and are the cathode of the diode. For example, referring to FIG. 5, the first nMOS transistor may be the nMOS transistor 520, and the second nMOS transistor may be the nMOS transistor 522, or the first nMOS transistor may be the nMOS transistor 522, and the second nMOS transistor may be the nMOS transistor 520. In one configuration, the diffusion region 528 may be considered the source of the nMOS transistors 520, 522, and the diffusion regions 524, 532 may be considered the drains of the nMOS transistors 520, 522, respectively. In another configuration, the diffusion regions 524, 532 may be considered the sources of the nMOS transistors 520, 522, respectively, and the diffusion region 528 may be considered the drain of the nMOS transistors 520, 522. As is clear, the first nMOS transistor source, the first nMOS transistor drain, the first nMOS transistor gate, the second nMOS transistor source, the second nMOS transistor drain, and the second nMOS transistor gate are all coupled together and are the cathode of the diode.

In one configuration, the first nMOS transistor source, the first nMOS transistor drain, the second nMOS transistor source, and the second nMOS transistor drain occupy at least three separate regions 524, 528, 532 separated by the first and second nMOS transistor gates 526, 530.

In one configuration, the MOS device further includes a first pMOS transistor having a first pMOS transistor source, a first pMOS transistor drain, a first pMOS transistor gate, and a pMOS transistor body; and includes a second pMOS transistor having a second pMOS transistor source, a second pMOS transistor drain, a second pMOS transistor gate, and the pMOS transistor body. For example, the first pMOS transistor may be the pMOS transistor 502 and the second pMOS transistor may be the pMOS transistor 504, or the first pMOS transistor may be the pMOS transistor 504 and the second pMOS transistor may be the pMOS transistor 502. The pMOS transistor body is coupled to a second voltage source $V_{dd}$ higher than the first voltage source $V_{ss}$. The first pMOS transistor source, the first pMOS transistor drain, the second pMOS transistor source, and the second pMOS transistor drain are coupled together to the second voltage source $V_{dd}$. The first pMOS transistor gate, the second pMOS transistor gate, the first nMOS transistor source, the first nMOS transistor drain, the first nMOS transistor gate, the second nMOS transistor source, the second nMOS transistor drain, and the second nMOS transistor gate are coupled together and are the cathode of the diode.

In one configuration, the first pMOS transistor source, the first pMOS transistor drain, the second pMOS transistor source, and the second pMOS transistor drain occupy at least three separate regions 506, 510, 514 separated by the first and second pMOS transistor gates 508, 512.

In one configuration, the first pMOS transistor gate and the first nMOS transistor gate are formed of a first gate interconnect extending in a first direction, and the second pMOS transistor gate and the second nMOS transistor gate are formed of a second gate interconnect extending parallel to the first gate interconnect in the first direction. For example, the gates 508/526 are formed by the same gate interconnect, and the gates 512/530 are formed by the same gate interconnect. In one configuration, the first pMOS transistor gate and the second pMOS transistor gate are coupled together with an MP layer interconnect 550 extending in a second direction orthogonal to the first direction.

In one configuration, the first nMOS transistor source, the first nMOS transistor drain, the second nMOS transistor source, and the second nMOS transistor drain are coupled by an M1 layer interconnect 540 to the first nMOS transistor gate, the second nMOS transistor gate, the first pMOS transistor gate, and the second pMOS transistor gate.

Referring again to FIGS. 1C, 4, and 5, a MOS diode includes a pMOS transistor 402 having a pMOS transistor source 406, a pMOS transistor drain 408, a pMOS transistor gate 404, and a pMOS transistor body 410. The pMOS transistor drain 408, the pMOS transistor source 406, and the pMOS transistor body 410 are coupled together and to a first voltage source $V_{dd}$. The MOS diode further includes an nMOS transistor 412 having an nMOS transistor source 416, an nMOS transistor drain 418, an nMOS transistor gate 414, and an nMOS transistor body 420. The nMOS transistor body is coupled to a second voltage source $V_{ss}$ and is an anode of the diode. The second voltage source $V_{ss}$ is lower than the first voltage source $V_{dd}$. The nMOS transistor gate 414, the nMOS transistor source 416, the nMOS transistor drain 418, and the pMOS transistor gate 404 are coupled together and are a cathode of the diode.

In one configuration, the nMOS transistor 412 includes a first nMOS transistor 520 and a second nMOS transistor 522. The first nMOS transistor 520 has a first nMOS transistor source (524 or 528), a first nMOS transistor drain (524 or 528), and a first nMOS transistor gate 526. The second nMOS transistor 522 has a second nMOS transistor source (528 or 532), a second nMOS transistor drain (528 or 532), and a second nMOS transistor gate 530. In one configuration, the first nMOS transistor source, the first nMOS transistor drain, the second nMOS transistor source, and the second nMOS transistor drain occupy at least three separate regions 524, 528, 532 separated by the first nMOS transistor gate 526 and the second nMOS transistor gate 530.

In one configuration, the pMOS transistor 402 includes a first pMOS transistor 502 and a second pMOS transistor 504. The first pMOS transistor 502 has a first pMOS transistor source (506 or 510), a first pMOS transistor drain (506 or 510), and a first pMOS transistor gate 508. The second pMOS transistor 504 has a second pMOS transistor source (510 or 514), a second pMOS transistor drain (510 or 514), and a second pMOS transistor gate 512. In one configuration, the first pMOS transistor source, the first pMOS transistor drain, the second pMOS transistor source, and the second pMOS transistor drain occupy at least three separate regions 506, 510, 514 separated by the first pMOS transistor gate 508 and the second pMOS transistor gate 512.

In one configuration, the first pMOS transistor gate 508 and the first nMOS transistor gate 526 are formed of a first gate interconnect 508/526 extending in a first direction, and the second pMOS transistor gate 512 and the second nMOS transistor gate 530 are formed of a second gate interconnect 512/530 extending parallel to the first gate interconnect in the first direction. In one configuration, the first pMOS transistor gate 508 and the second pMOS transistor gate 512 are coupled together with an MP layer interconnect 550 extending in a second direction orthogonal to the first direction. In one configuration, the first nMOS transistor source, the first nMOS transistor drain, the second nMOS transistor source, and the second nMOS transistor drain are coupled by an M1 layer interconnect 540 to the first nMOS transistor gate, the second nMOS transistor gate, the first pMOS transistor gate, and the second pMOS transistor gate.

In one configuration, a MOS device for reducing an antenna effect is provided. The MOS device includes means for flowing a current from an interconnect extending between a driver output and a load input to a cathode of a diode. Such means may be the interconnect 106. The MOS device further includes means for flowing the current from the cathode of the diode to an anode of the diode. Such means in the antenna diode of FIGS. 4, 5. The diode includes a first nMOS transistor having a first nMOS transistor source, a first nMOS transistor drain, a first nMOS transistor gate, and an nMOS transistor body. The nMOS transistor body is coupled to a first voltage source and is the anode of the diode. The first nMOS transistor source, the first nMOS transistor drain, and the first nMOS transistor gate are coupled together and are the cathode of the diode.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. The term "connected" means "directly connected." The term "coupled" means "connected" or "indirectly connected" through other elements. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A metal oxide semiconductor (MOS) device for reducing an antenna effect, comprising:
    a diode comprising a first n-type MOS (nMOS) transistor having a first nMOS transistor source, a first nMOS transistor drain, a first nMOS transistor gate, and an nMOS transistor body, the nMOS transistor body being coupled to a first voltage source and being an anode of the diode, wherein the first nMOS transistor source, the first nMOS transistor drain, and the first nMOS transistor gate are coupled together and are a cathode of the diode; and an interconnect extending between a driver output and a load input, the interconnect being coupled to the cathode of the diode.

2. The MOS device of claim 1, wherein the diode further comprises a second nMOS transistor having a second nMOS transistor source, a second nMOS transistor drain, a second nMOS transistor gate, and the nMOS transistor body, wherein the first nMOS transistor source, the first nMOS transistor drain, the first nMOS transistor gate, the second nMOS transistor source, the second nMOS transistor drain, and the second nMOS transistor gate are coupled together and are said cathode of the diode.

3. The MOS device of claim 2, wherein the first nMOS transistor source, the first nMOS transistor drain, the second nMOS transistor source, and the second nMOS transistor drain comprise at least three separate regions separated by the first nMOS transistor gate and the second nMOS transistor gate.

4. The MOS device of claim 2, further comprising:
a first p-type MOS (pMOS) transistor having a first pMOS transistor source, a first pMOS transistor drain, a first pMOS transistor gate, and a pMOS transistor body; and
a second pMOS transistor having a second pMOS transistor source, a second pMOS transistor drain, a second pMOS transistor gate, and the pMOS transistor body, the pMOS transistor body being coupled to a second voltage source higher than the first voltage source,
wherein the first pMOS transistor source, the first pMOS transistor drain, the second pMOS transistor source, and the second pMOS transistor drain are coupled together to the second voltage source, and
wherein the first pMOS transistor gate, the second pMOS transistor gate, the first nMOS transistor source, the first nMOS transistor drain, the first nMOS transistor gate, the second nMOS transistor source, the second nMOS transistor drain, and the second nMOS transistor gate are coupled together and are said cathode of the diode.

5. The MOS device of claim 4, wherein the first pMOS transistor source, the first pMOS transistor drain, the second pMOS transistor source, and the second pMOS transistor drain comprise at least three separate regions separated by the first pMOS transistor gate and the second pMOS transistor gate.

6. The MOS device of claim 4, wherein the first pMOS transistor gate and the first nMOS transistor gate are formed of a first gate interconnect extending in a first direction, and the second pMOS transistor gate and the second nMOS transistor gate are formed of a second gate interconnect extending parallel to the first gate interconnect in the first direction.

7. The MOS device of claim 6, wherein the first pMOS transistor gate and the second pMOS transistor gate are coupled together with a metal POLY (MP) layer interconnect extending in a second direction orthogonal to the first direction.

8. The MOS device of claim 4, wherein the first nMOS transistor source, the first nMOS transistor drain, the second nMOS transistor source, and the second nMOS transistor drain are coupled by a metal one (M1) layer interconnect to the first nMOS transistor gate, the second nMOS transistor gate, the first pMOS transistor gate, and the second pMOS transistor gate.

9. The MOS device of claim 1, wherein the interconnect extends on one metal layer only between the driver output and the load input.

10. A metal oxide semiconductor (MOS) diode, comprising:
a p-type MOS (pMOS) transistor having a pMOS transistor source, a pMOS transistor drain, a pMOS transistor gate, and a pMOS transistor body, wherein the pMOS transistor drain, the pMOS transistor source, and the pMOS transistor body are coupled together and to a first voltage source; and
an n-type MOS (nMOS) transistor having an nMOS transistor source, an nMOS transistor drain, an nMOS transistor gate, and an nMOS transistor body, the nMOS transistor body being coupled to a second voltage source and being an anode of the diode, the second voltage source being lower than the first voltage source, wherein the nMOS transistor gate, the nMOS transistor source, the nMOS transistor drain, and the pMOS transistor gate are coupled together and are a cathode of the diode.

11. The MOS diode of claim 10, wherein the nMOS transistor comprises a first nMOS transistor and a second nMOS transistor, the first nMOS transistor having a first nMOS transistor source, a first nMOS transistor drain, and a first nMOS transistor gate, the second nMOS transistor having a second nMOS transistor source, a second nMOS transistor drain, and a second nMOS transistor gate.

12. The MOS diode of claim 11, wherein the first nMOS transistor source, the first nMOS transistor drain, the second nMOS transistor source, and the second nMOS transistor drain comprise at least three separate regions separated by the first nMOS transistor gate and the second nMOS transistor gate.

13. The MOS diode of claim 11, wherein the pMOS transistor comprises a first pMOS transistor and a second pMOS transistor, the first pMOS transistor having a first pMOS transistor source, a first pMOS transistor drain, and a first pMOS transistor gate, the second pMOS transistor having a second pMOS transistor source, a second pMOS transistor drain, and a second pMOS transistor gate.

14. The MOS diode of claim 13, wherein the first pMOS transistor source, the first pMOS transistor drain, the second pMOS transistor source, and the second pMOS transistor drain comprise at least three separate regions separated by the first pMOS transistor gate and the second pMOS transistor gate.

15. The MOS diode of claim 13, wherein the first pMOS transistor gate and the first nMOS transistor gate are formed of a first gate interconnect extending in a first direction, and the second pMOS transistor gate and the second nMOS transistor gate are formed of a second gate interconnect extending parallel to the first gate interconnect in the first direction.

16. The MOS diode of claim 15, wherein the first pMOS transistor gate and the second pMOS transistor gate are coupled together with a metal POLY (MP) layer interconnect extending in a second direction orthogonal to the first direction.

17. The MOS diode of claim 13, wherein the first nMOS transistor source, the first nMOS transistor drain, the second nMOS transistor source, and the second nMOS transistor drain are coupled by a metal one (M1) layer interconnect to the first nMOS transistor gate, the second nMOS transistor gate, the first pMOS transistor gate, and the second pMOS transistor gate.

18. A method of operation of a metal oxide semiconductor (MOS) device for reducing an antenna effect, comprising:
flowing a current from an interconnect extending between a driver output and a load input to a cathode of a diode; and
flowing the current from the cathode of the diode to an anode of the diode, the diode comprising a first n-type MOS (nMOS) transistor having a first nMOS transistor source, a first nMOS transistor drain, a first nMOS transistor gate, and an nMOS transistor body, the nMOS transistor body being coupled to a first voltage source and being the anode of the diode, wherein the first nMOS transistor source, the first nMOS transistor drain, and the first nMOS transistor gate are coupled together and are the cathode of the diode.

19. The method of claim 18, wherein the diode further comprises a second nMOS transistor having a second nMOS transistor source, a second nMOS transistor drain, a second nMOS transistor gate, and the nMOS transistor body, wherein the first nMOS transistor source, the first nMOS transistor drain, the first nMOS transistor gate, the second nMOS transistor source, the second nMOS transistor drain, and the second nMOS transistor gate are coupled together and are said cathode of the diode.

20. The method of claim 19, wherein the first nMOS transistor source, the first nMOS transistor drain, the second nMOS transistor source, and the second nMOS transistor drain comprise at least three separate regions separated by the first nMOS transistor gate and the second nMOS transistor gate.

21. The method of claim 19, wherein the diode further comprises:
a first p-type MOS (pMOS) transistor having a first pMOS transistor source, a first pMOS transistor drain, a first pMOS transistor gate, and a pMOS transistor body; and
a second pMOS transistor having a second pMOS transistor source, a second pMOS transistor drain, a second pMOS transistor gate, and the pMOS transistor body, the pMOS transistor body being coupled to a second voltage source higher than the first voltage source,
wherein the first pMOS transistor source, the first pMOS transistor drain, the second pMOS transistor source, and the second pMOS transistor drain are coupled together to the second voltage source, and
wherein the first pMOS transistor gate, the second pMOS transistor gate, the first nMOS transistor source, the first nMOS transistor drain, the first nMOS transistor gate, the second nMOS transistor source, the second nMOS transistor drain, and the second nMOS transistor gate are coupled together and are said cathode of the diode.

22. The method of claim 21, wherein the first pMOS transistor source, the first pMOS transistor drain, the second pMOS transistor source, and the second pMOS transistor drain comprise at least three separate regions separated by the first pMOS transistor gate and the second pMOS transistor gate.

23. The method of claim 21, wherein the first pMOS transistor gate and the first nMOS transistor gate are formed of a first gate interconnect extending in a first direction, and the second pMOS transistor gate and the second nMOS transistor gate are formed of a second gate interconnect extending parallel to the first gate interconnect in the first direction.

24. A metal oxide semiconductor (MOS) device for reducing an antenna effect, comprising:
means for flowing a current from an interconnect extending between a driver output and a load input to a cathode of a diode; and
means for flowing the current from the cathode of the diode to an anode of the diode, the diode comprising a first n-type MOS (nMOS) transistor having a first nMOS transistor source, a first nMOS transistor drain, a first nMOS transistor gate, and an nMOS transistor body, the nMOS transistor body being coupled to a first voltage source and being the anode of the diode, wherein the first nMOS transistor source, the first nMOS transistor drain, and the first nMOS transistor gate are coupled together and are the cathode of the diode.

25. The MOS device of claim 24, wherein the diode further comprises a second nMOS transistor having a second nMOS transistor source, a second nMOS transistor drain, a second nMOS transistor gate, and the nMOS transistor body, wherein the first nMOS transistor source, the first nMOS transistor drain, the first nMOS transistor gate, the second nMOS transistor source, the second nMOS transistor drain, and the second nMOS transistor gate are coupled together and are said cathode of the diode.

26. The MOS device of claim 25, wherein the first nMOS transistor source, the first nMOS transistor drain, the second nMOS transistor source, and the second nMOS transistor drain comprise at least three separate regions separated by the first nMOS transistor gate and the second nMOS transistor gate.

27. The MOS device of claim 25, wherein the diode further comprises:
a first p-type MOS (pMOS) transistor having a first pMOS transistor source, a first pMOS transistor drain, a first pMOS transistor gate, and a pMOS transistor body; and
a second pMOS transistor having a second pMOS transistor source, a second pMOS transistor drain, a second pMOS transistor gate, and the pMOS transistor body, the pMOS transistor body being coupled to a second voltage source higher than the first voltage source,
wherein the first pMOS transistor source, the first pMOS transistor drain, the second pMOS transistor source, and the second pMOS transistor drain are coupled together to the second voltage source, and
wherein the first pMOS transistor gate, the second pMOS transistor gate, the first nMOS transistor source, the first nMOS transistor drain, the first nMOS transistor gate, the second nMOS transistor source, the second nMOS transistor drain, and the second nMOS transistor gate are coupled together and are said cathode of the diode.

28. The MOS device of claim 27, wherein the first pMOS transistor source, the first pMOS transistor drain, the second pMOS transistor source, and the second pMOS transistor drain comprise at least three separate regions separated by the first pMOS transistor gate and the second pMOS transistor gate.

29. The MOS device of claim 27, wherein the first pMOS transistor gate and the first nMOS transistor gate are formed of a first gate interconnect extending in a first direction, and the second pMOS transistor gate and the second nMOS transistor gate are formed of a second gate interconnect extending parallel to the first gate interconnect in the first direction.

30. The MOS device of claim 24, wherein the interconnect extends on one metal layer only between the driver output and the load input.

* * * * *